US012633331B2

(12) United States Patent
Shiokawa

(10) Patent No.: US 12,633,331 B2
(45) Date of Patent: May 19, 2026

(54) MAGNETORESISTANCE EFFECT ELEMENT AND MAGNETIC RECORDING ARRAY FOR ENHANCED INTEGRATION DENSITY

(71) Applicant: TDK CORPORATION, Tokyo (JP)

(72) Inventor: Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 748 days.

(21) Appl. No.: 17/928,330

(22) PCT Filed: Jun. 2, 2020

(86) PCT No.: PCT/JP2020/021691
§ 371 (c)(1),
(2) Date: Nov. 29, 2022

(87) PCT Pub. No.: WO2021/245768
PCT Pub. Date: Dec. 9, 2021

(65) Prior Publication Data
US 2023/0215480 A1     Jul. 6, 2023

(51) Int. Cl.
H10N 50/10 (2023.01)
G11C 5/08 (2006.01)
G11C 11/16 (2006.01)
H10B 61/00 (2023.01)

(52) U.S. Cl.
CPC ............ G11C 11/1675 (2013.01); G11C 5/08 (2013.01); G11C 11/161 (2013.01); H10B 61/22 (2023.02); H10N 50/10 (2023.02)

(58) Field of Classification Search
CPC .. G11C 11/1659; G11C 11/1675; H10B 61/22
See application file for complete search history.

(56) References Cited

U.S. PATENT DOCUMENTS

| | | | |
|---|---|---|---|
| 12,339,334 B2* | 6/2025 | Suemitsu | ............... H10B 61/22 |
| 2005/0036361 A1* | 2/2005 | Fukuzumi | ............. H10B 61/22 |
| | | | 365/158 |
| 2014/0281279 A1 | 9/2014 | Oh et al. | |
| 2020/0043535 A1* | 2/2020 | Bozdag | .................. H10N 50/10 |

FOREIGN PATENT DOCUMENTS

| | | |
|---|---|---|
| JP | 6510758 B2 | 5/2019 |
| WO | 2009/057504 A1 | 5/2009 |
| WO | 2009/078244 A1 | 6/2009 |

OTHER PUBLICATIONS

Aug. 11, 2020 International Search Report issued in International Patent Application No. PCT/JP2020/021691.

* cited by examiner

*Primary Examiner* — William B Partridge
*Assistant Examiner* — Mehek Ahmed
(74) *Attorney, Agent, or Firm* — Oliff PLC

(57) ABSTRACT

A magnetoresistance effect element includes a wiring that extends in a first direction, a laminate that includes a first ferromagnetic layer connected to the wiring, a first conductive part and a second conductive part that sandwich the first ferromagnetic layer therebetween in a plan view in a lamination direction, and a resistor that has a geometrical center overlapping a geometrical center of the first conductive part or farther away from the laminate than the geometrical center of the first conductive part in the first direction when viewed in a plan view in the lamination direction.

19 Claims, 9 Drawing Sheets

MAGNETORESISTANCE EFFECT ELEMENT AND MAGNETIC RECORDING ARRAY FOR ENHANCED INTEGRATION DENSITY

TECHNICAL FIELD

The present invention relates to a magnetoresistance effect element and a magnetic recording array.

BACKGROUND ART

Since limitations in the miniaturization of flash memory devices and the like have become apparent, nonvolatile memory devices are attracting attention as a replacement. For example, magnetoresistive random access memory (MRAM), resistance random access memory (ReRAM), phase change random access memory (PCRAM), and the like are known as next-generation nonvolatile memory.

An MRAM is a memory device using magnetoresistance effect elements. A resistance value of a magnetoresistance effect element varies depending on a difference between relative angles of magnetization directions of two magnetic films. The MRAM records the resistance value of the magnetoresistance effect element as data.

A memory device may have a reference cell in order to enhance reliability of data (for example, Patent Literature 1). Erroneous writing, erroneous reading, and the like can be prevented by contrasting data of the reference cell and data of the memory cell with each other.

CITATION LIST

Patent Literature

[Patent Literature 1]
Japanese Patent No. 6510758

SUMMARY OF INVENTION

Technical Problem

A reference cell is for data reference and does not record data. In a memory device, the larger the area occupied by a reference cell, the smaller the storage capacity per unit area of the memory device. That is, a reference cell is one of the causes of low integration of a memory device.

The present invention has been made in consideration of the foregoing problems, and an object thereof is to provide a magnetic recording array having high integration and a magnetoresistance effect element capable of enhancing integration.

Solution to Problem (1) A magnetoresistance effect element according to a first aspect includes a wiring that extends in a first direction, a laminate that includes a first ferromagnetic layer connected to the wiring, a first conductive part and a second conductive part that sandwich the first ferromagnetic layer therebetween in a plan view in a lamination direction, and a resistor, wherein, in the plan view in the lamination direction, a geometrical center of the resistor overlaps a geometrical center of the first conductive portion or offsets from the geometrical center of the first conductive portion in the first direction away from the laminate.

(2) In the magnetoresistance effect element according to the foregoing aspect, a resistance value or a potential difference of the resistor in the lamination direction may be referred to as a resistance value or a potential difference of the laminate in the lamination direction.

(3) In the magnetoresistance effect element according to the foregoing aspect, the resistor may have the same layer structure as the laminate. The resistor may include the first ferromagnetic layer.

(4) In the magnetoresistance effect element according to the foregoing aspect, the laminate may have the first ferromagnetic layer, a second ferromagnetic layer, and a non-magnetic layer provided between the first ferromagnetic layer and the second ferromagnetic layer.

(5) In the magnetoresistance effect element according to the foregoing aspect, a volume of the first ferromagnetic layer in the resistor may be larger than a volume of the first ferromagnetic layer in the laminate.

(6) An area of the first ferromagnetic layer in the resistor may be larger than an area of the first ferromagnetic layer in the laminate when the magnetoresistance effect element according to the foregoing aspect is viewed in the lamination direction.

(7) In the magnetoresistance effect element according to the foregoing aspect, the laminate and the resistor may have shape anisotropy when viewed in the lamination direction. An aspect ratio of a major axis to a minor axis in the resistor may be larger than an aspect ratio of a major axis to a minor axis in the laminate.

(8) The magnetoresistance effect element according to the foregoing aspect may further include a control unit that controls a first writing operation and a second writing operation, wherein the first writing operation includes causing an electric current to flow between the first conductive part and the second conductive part and changing a magnetization direction of the first ferromagnetic layer of the laminate, and the second writing operation includes causing an electric current to flow in the lamination direction of the resistor and changing a magnetization direction of the first ferromagnetic layer of the resistor.

(9) The geometrical center of the resistor may be located at a position overlapping the first conductive part when the magnetoresistance effect element according to the foregoing aspect is viewed in the lamination direction.

(10) In the magnetoresistance effect element according to the foregoing aspect, a width of the wiring in a second direction at a position of the geometrical center of the resistor may be wider than a width of the wiring in the second direction at a position of a geometrical center of the laminate, the second direction being orthogonal to the first direction and the lamination direction.

(11) The magnetoresistance effect element according to the foregoing aspect may further include a first transistor that is connected to the resistor, and a second transistor that is connected to the laminate. A gate electrode of the first transistor and a gate electrode of the second transistor may be connected to the same gate wiring.

(12) The magnetoresistance effect element according to the foregoing aspect may further include a sense amplifier that is connected to the resistor and the laminate.

(13) The magnetoresistance effect element according to the foregoing aspect may further include a second resistor. In the plan view in the lamination direction, a geometrical center of the second resistor may overlap a geometrical center of the second conductive part or may offset from the geometrical center of the second conductive part in the first direction away from the laminate.

(14) A magnetic recording array according to a second aspect includes the magnetoresistance effect element according to the foregoing aspect.

(15) The magnetic recording array according to the foregoing aspect may include a plurality of resistance change elements that are arrayed in a matrix shape. Some of the plurality of resistance change elements may be the magnetoresistance effect elements, each of which is the magnetoresistance effect element according to the foregoing aspect.

(16) The magnetic recording array according to the foregoing aspect may further include a plurality of the magnetoresistance effect elements, each of which is the magnetoresistance effect element according to the foregoing aspect. Each of the resistors in the magnetoresistance effect elements may have the first ferromagnetic layer, a second ferromagnetic layer, and a non-magnetic layer provided between the first ferromagnetic layer and the second ferromagnetic layer. The plurality of magnetoresistance effect elements each may have a first element and a second element. In the first element, a magnetization direction of the first ferromagnetic layer and a magnetization direction of the second ferromagnetic layer in the resistor may be parallel to each other. In the second element, the magnetization direction of the first ferromagnetic layer and the magnetization direction of the second ferromagnetic layer in the resistor may be antiparallel to each other.

(17) The magnetic recording array according to the foregoing aspect may further include a plurality of resistance change elements that are arrayed in a matrix shape. Each of element groups may have the first element and the second element, the element groups being constituted of the resistance change elements which belong to the same row or column in the plurality of resistance change elements.

(18) In the magnetic recording array according to the foregoing aspect, all of the plurality of resistance change elements may be the magnetoresistance effect elements.

Advantageous Effects of Invention

In the magnetoresistance effect element according to the foregoing aspect, integration of a magnetic recording array can be enhanced.

BRIEF DESCRIPTION OF DRAWINGS

FIG. 11 is a circuit diagram of a magnetic recording array according to the fourth embodiment.

FIG. 13 is a cross-sectional view of a magnetoresistance effect element according to a sixth embodiment.

DESCRIPTION OF EMBODIMENTS

Hereinafter, the present embodiment will be described in detail suitably with reference to the drawings. In drawings used in the following description, in order to make characteristics easy to understand, characteristic parts may be illustrated in an enlarged manner for the sake of convenience, and dimensional ratios or the like of each constituent element may differ from actual values thereof. Exemplary materials, dimensions, and the like illustrated in the following description are merely examples. The present invention is not limited thereto and can be suitably changed and performed within a range in which the effects of the present invention are exhibited.

First, directions will be defined. One direction within a plane of a substrate Sub which will be described below (refer to FIG. 2) will be referred to as an x direction, and a direction orthogonal to the x direction will be referred to as a y direction. For example, the x direction is a row direction in which magnetoresistance effect elements are arrayed in a magnetic recording array which will be described below. For example, the y direction is a column direction in which magnetoresistance effect elements are arrayed in the magnetic recording array which will be described below. A z direction is a direction orthogonal to the x direction and the y direction. The z direction is an example of a lamination direction. The x direction is an example of a first direction and intersects (for example, is orthogonal to) the first direction and the lamination direction. Hereinafter, the positive z direction may be expressed as "upward", and the negative z direction may be expressed as "downward". The upward and downward directions do not necessarily coincide with the direction in which the force of gravity acts.

In addition, in this specification, "extending in the first direction" denotes that the length in the first direction is longer than the lengths in other directions. In addition, in this specification, "connection" is not limited to direct connection and includes connection with a layer therebetween.

First Embodiment

Figure 1:
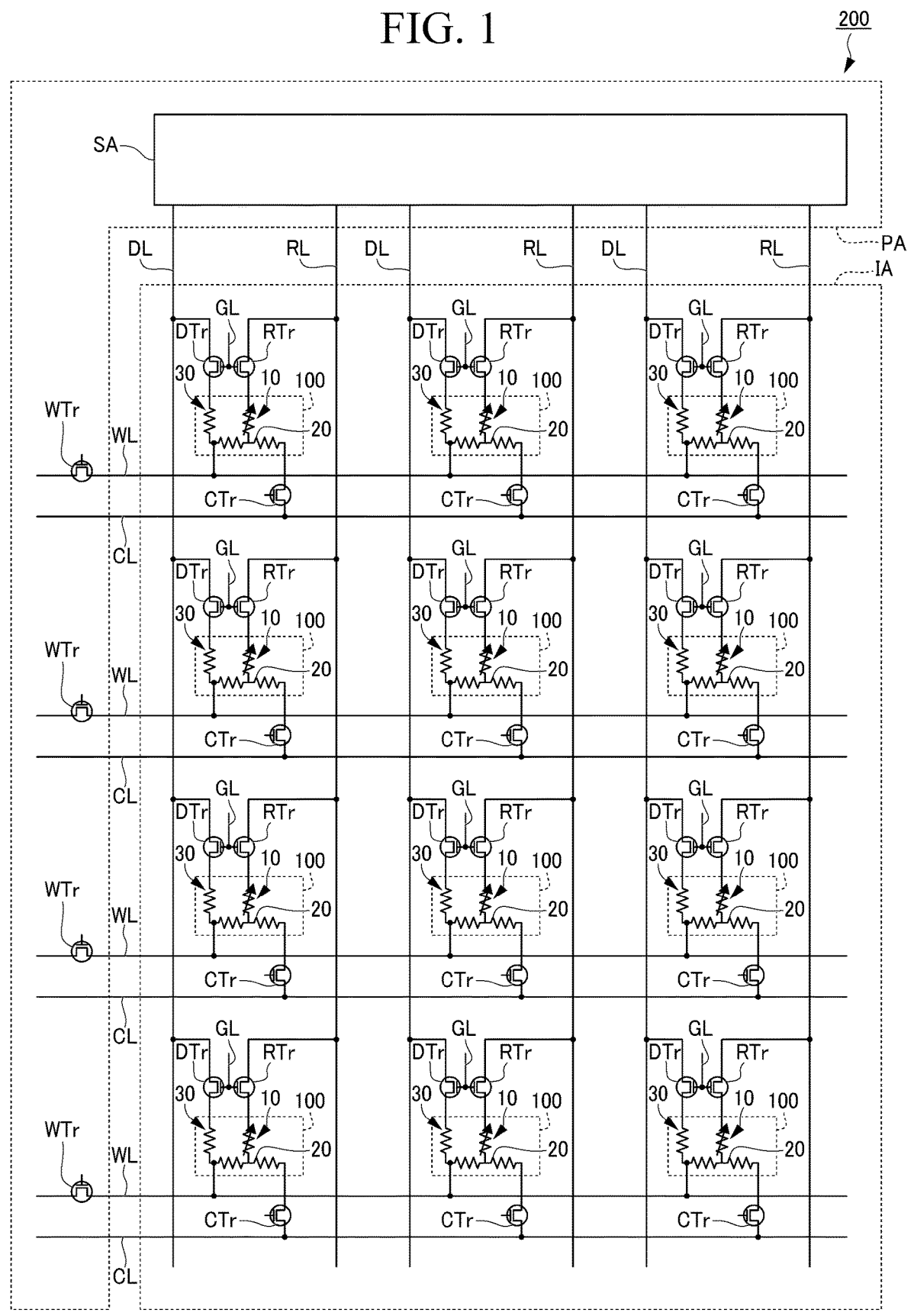
FIG. 1 is a circuit diagram of a magnetic recording array according to a first embodiment.

FIG. 1 is a circuit diagram of a magnetic recording array 200 according to a first embodiment. The magnetic recording array 200 has an integrated region IA and a peripheral region PA.

The integrated region IA is a region in which a plurality of magnetoresistance effect elements 100 are integrated. The peripheral region PA is a region in which peripheral circuits for controlling operations of the magnetoresistance effect elements 100 within the integrated region IA are mounted. For example, the peripheral region PA is on an outward side of the integrated region IA. An integration density of the magnetoresistance effect elements 100 within the integrated region IA significantly affects a recording density of the magnetic recording array 200 in its entirety. The higher the integration density of the magnetoresistance effect elements 100 in the integrated region IA, the higher the recording density of the magnetic recording array 200.

For example, the integrated region IA has a plurality of magnetoresistance effect elements 100, a plurality of differential transistors DTr, a plurality of reading transistors RTr, and a plurality of common transistors CTr. For example, the peripheral region PA has a plurality of writing transistors WTr and peripheral circuits. For example, peripheral circuits include a control unit that controls an electric current flowing in a sense amplifier SA, a data latch, and gate wirings GL. Writing wirings WL, reading wirings RL, differential wirings DL, and common wirings CL connect the integrated region IA and the peripheral region PA to each other.

For example, the magnetoresistance effect elements 100 are arrayed in a matrix shape. For example, all resistance change elements included within the integrated region IA are the magnetoresistance effect elements 100 according to the first embodiment. Details of the magnetoresistance effect elements 100 will be described below.

The writing wirings WL are electrically connected to wirings 20 of the magnetoresistance effect elements 100. The writing wirings WL are connected throughout the respective magnetoresistance effect elements 100 which belong to the same column or row. For example, the writing wirings WL are connected to the respective magnetoresistance effect elements 100 in the same row.

The writing transistors WTr are connected to the writing wirings WL. The writing transistors WTr control an electric current flowing in the writing wirings WL. The writing transistors WTr may be respectively disposed between the writing wirings WL and the wirings 20 and control an electric current flowing between the writing wirings WL and the wirings 20.

The reading wirings RL are electrically connected to laminates 10 of the magnetoresistance effect elements 100. The reading wirings RL are connected throughout the respective magnetoresistance effect elements 100 which belong to the same column or row. For example, the reading wiring RL are connected to the respective magnetoresistance effect elements 100 in the same column.

The reading transistors RTr are connected to the reading wirings RL. The reading transistors RTr control an electric current flowing between the reading wirings RL and the laminates 10. The reading transistors RTr may be disposed at one ends of the reading wirings RL and control an electric current flowing in the writing reading wiring RL. The reading transistors RTr are examples of second transistors.

The common wirings CL are electrically connected to the wirings 20 of the magnetoresistance effect elements 100. The common wirings CL are connected throughout the respective magnetoresistance effect elements 100 which belong to the same column or row. For example, the common wirings CL are connected to the respective magnetoresistance effect elements 100 in the same column.

The common transistors CTr are connected to the common wirings CL. The common transistors CTr control an electric current flowing between the common wirings CL and the wirings 20. The common transistors CTr may be disposed at one end of the respective common wirings CL and control an electric current flowing in the respective common wirings CL.

The differential wirings DL are electrically connected to resistors 30 of the magnetoresistance effect elements 100. The differential wirings DL are connected throughout the respective magnetoresistance effect elements 100 which belong to the same column or row. For example, the differential wirings DL are connected to the respective magnetoresistance effect elements 100 in the same column.

The differential transistors DTr are connected to the differential wirings DL. The differential transistors DTr control an electric current flowing between the differential wirings DL and the resistors 30. The differential transistors DTr are examples of first transistors. For example, gate electrodes of the differential transistors DTr and gate electrodes of the reading transistors RTr are connected to the same gate wirings GL. For example, the differential transistors DTr and the reading transistors RTr simultaneously switch between ON and OFF.

The sense amplifier SA detects differences between resistance values or potential differences of the resistors 30 and resistance values or potential differences of the laminates 10. For example, the sense amplifier SA compares potentials of the reading wirings RL and potentials of the differential wirings DL and reads data recorded in the magnetoresistance effect elements 100. The differences between the resistance values or the potential differences of the resistors 30 and the resistance values or the potential differences of the laminates 10 may be read by a device other than the sense amplifier SA.

The data latch temporarily stores data read by the sense amplifier SA. The data stored in the data latch is read by an amount of data corresponding to one page. The control unit controls the ON/OFF state of each transistor. For example, the control unit controls an writing operation and a reading operation with respect to the magnetoresistance effect elements 100. For example, the control unit is connected to each of the gate electrodes of the writing transistors WTr, the reading transistors RTr, the common transistors CTr, and the differential transistors DTr.

For example, the writing transistors WTr, the reading transistors RTr, the common transistors CTr, and the differential transistors DTr are field effect transistors. The writing transistors WTr, the reading transistors RTr, the common transistors CTr, and the differential transistors DTr may be replaced with different switching elements. Examples of switching elements include elements utilizing phase change in crystal layers as ovonic threshold switches (OTS), elements utilizing change in band structures as metal insulator transition (MIT) switches, elements utilizing a breakdown voltage as Zener diodes and avalanche diodes, and elements in which conductivity changes in accordance with change in atom position.

Figure 2:
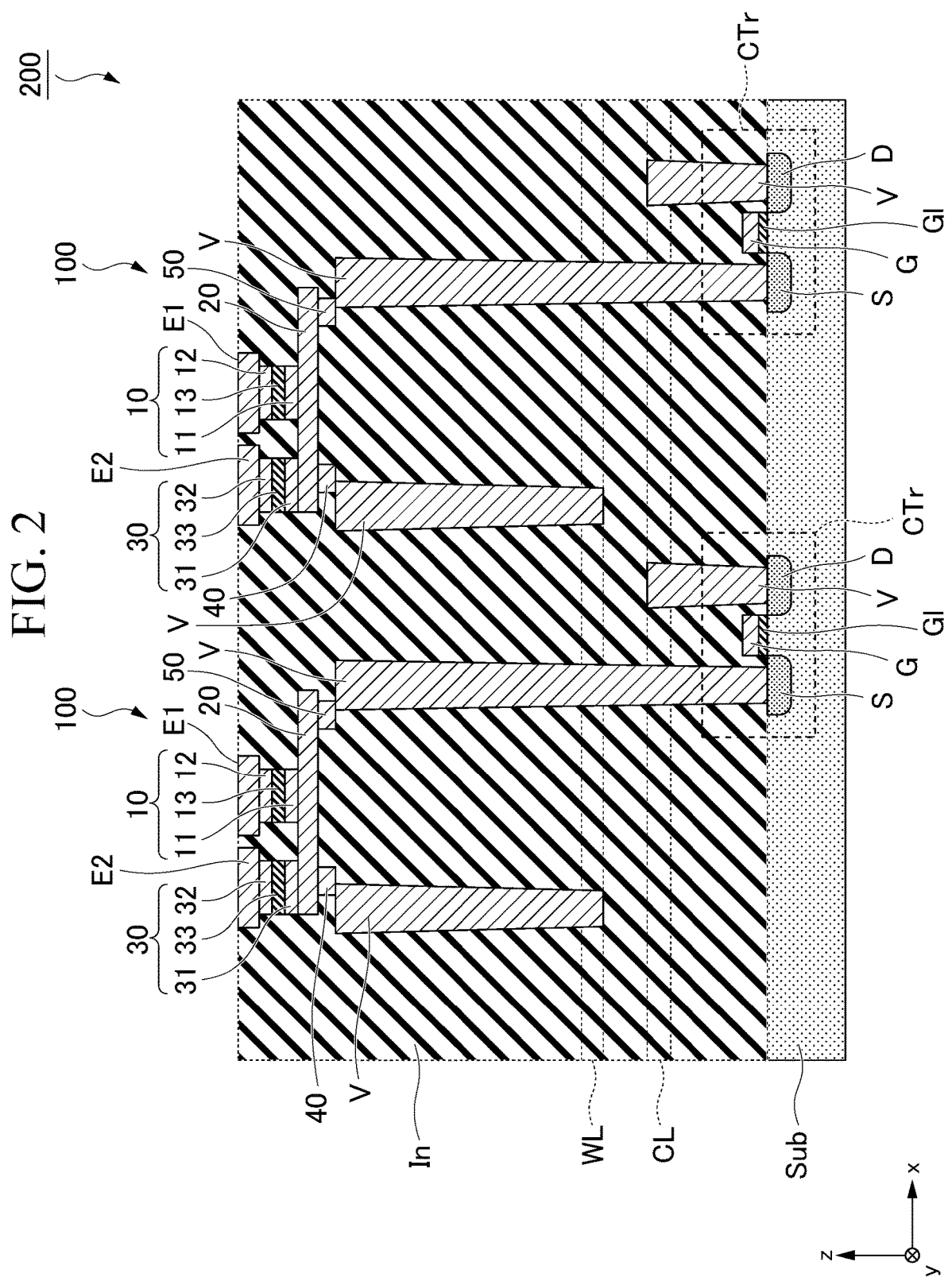
FIG. 2 is a cross-sectional view of the magnetic recording array according to the first embodiment.

FIG. 2 is a cross-sectional view of the magnetic recording array 200 according to the first embodiment. FIG. 2 is an xz cross section passing through the center of the magnetoresistance effect element 100 in the y direction. In FIG. 2, for the sake of description, the writing wiring WL and the common wiring CL located at different positions in the y direction are indicated by dotted lines. The writing transistors WTr, the reading transistors RTr, and the differential transistors DTr are located at different positions in the y direction.

The writing transistors WTr, the reading transistors RTr, the common transistors CTr, and the differential transistors DTr are located on the substrate Sub. The magnetoresistance effect elements 100 are located in a layer different from these transistors on the substrate Sub. The magnetoresistance effect elements 100 and these transistors are located at different positions in the z direction. The magnetoresistance effect elements 100 and these transistors are connected to each other via via-wirings V.

Areas around the magnetoresistance effect elements 100, these transistors, and the via-wirings V are covered by an insulating layer In. The insulating layer In is an insulating layer for insulating wirings or elements in multilayer-wirings from each other. For example, the insulating layer In is made of silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

For example, these transistors are field effect transistors. For example, the transistors each have a gate electrode G, a gate insulating film GI, a source region S, and a drain region D. The source region S and the drain region D are names stipulated depending on a flowing direction of an electric current, and the positions thereof vary in accordance with the flowing direction of an electric current. The source region S and the drain region D are formed on the substrate Sub. For example, the substrate Sub is a semiconductor substrate. The gate electrode G is sandwiched between the source region S and the drain region D when viewed in the z direction. The gate electrode G controls a flow of electric charges between the source region S and the drain region D.

Figure 3:
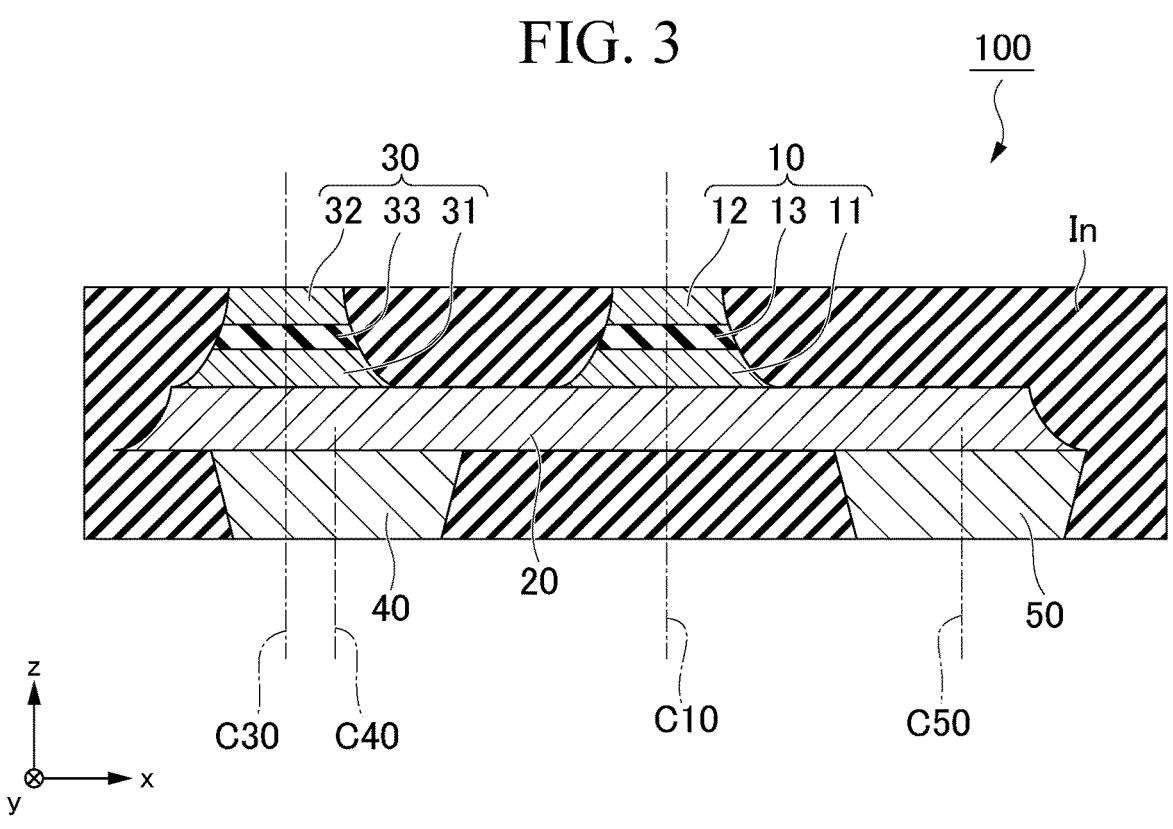
FIG. 3 is a cross-sectional view of a magnetoresistance effect element according to the first embodiment.
Figure 4:
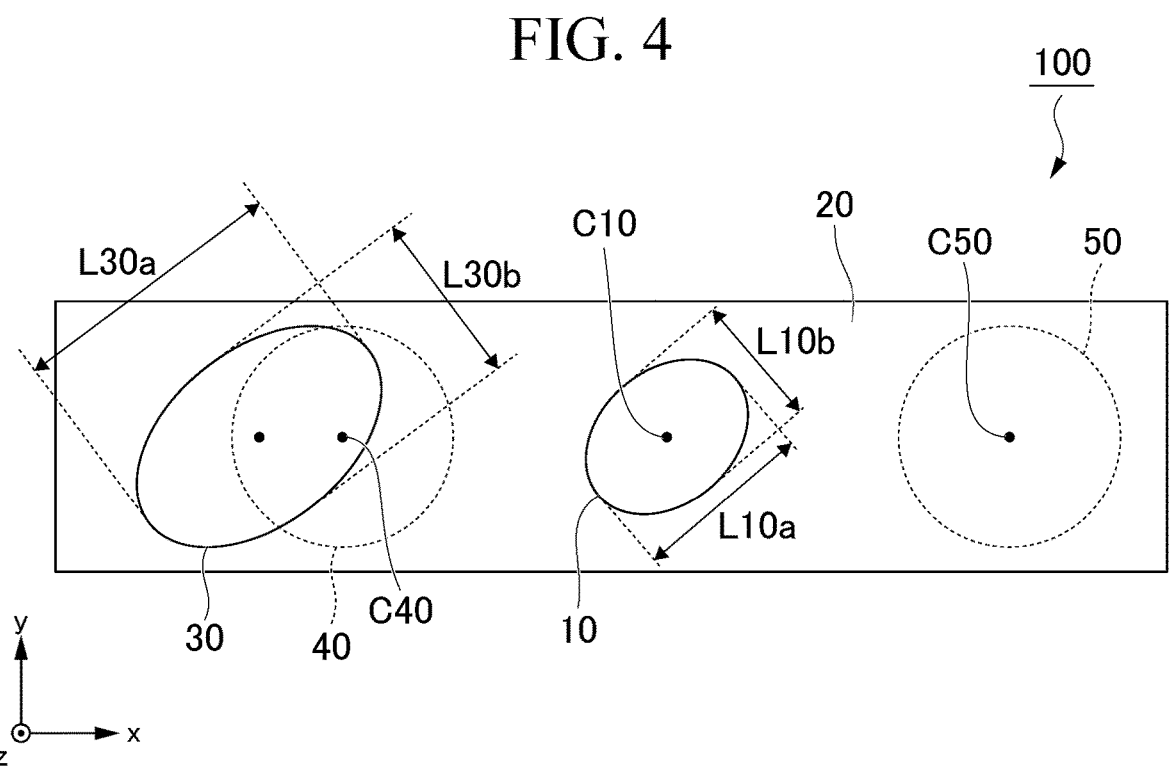
FIG. 4 is a plan view of the magnetoresistance effect element according to the first embodiment.

FIG. 3 is a cross-sectional view of the magnetoresistance effect element 100 according to the first embodiment. FIG. 3 is a cross section of the magnetoresistance effect element 100 cut along an xz plane passing through the center of the width of the wiring 20 in the y direction. FIG. 4 is a plan view of the magnetoresistance effect element 100 according to the first embodiment.

For example, the magnetoresistance effect element 100 includes the laminate 10, the wiring 20, the resistor 30, a first conductive part 40, and a second conductive part 50. The resistance value of the laminate 10 in the z direction changes when spins are injected into the laminate 10 through the wiring 20. The magnetoresistance effect element 100 is a spin element utilizing a spin-orbit torque (SOT) and may be referred to as a spin-orbit torque-type magnetoresistance effect element, a spin injection-type magnetoresistance effect element, or a spin current magnetoresistance effect element. In addition, the wiring 20 may be referred to as a spin-orbit torque wiring.

The laminate 10 is laminated on the wiring 20. Another layer may be provided between the laminate 10 and the wiring 20. The laminate 10 is sandwiched between the wiring 20 and an electrode E1 (refer to FIG. 2) in the z direction. The laminate 10 is a columnar body. For example, the laminate 10 has shape anisotropy when viewed in the z direction. Having shape anisotropy denotes that a circumscribed ellipse including the laminate 10 has a major axis and a minor axis. For example, the laminate 10 is an ellipse as illustrated in FIG. 4 when viewed in the z direction. The shape of the laminate 10 viewed in the z direction is not limited to this case and may be a circular shape, a quadrangular shape, or an amorphous shape.

The laminate 10 has a first ferromagnetic layer 11, a second ferromagnetic layer 12, and a non-magnetic layer 13. For example, the first ferromagnetic layer 11 comes into contact with the wiring 20 and is laminated on the wiring 20. Spins are injected into the first ferromagnetic layer 11 through the wiring 20. The magnetization of the first ferromagnetic layer 11 receives spin-orbit torques (SOT) due to injected spins so that the orientation direction thereof changes. The second ferromagnetic layer 12 is on the first ferromagnetic layer 11 in the z direction. The first ferromagnetic layer 11 and the second ferromagnetic layer 12 sandwich the non-magnetic layer 13 therebetween in the z direction.

Each of the first ferromagnetic layer 11 and the second ferromagnetic layer 12 has a magnetization. The orientation direction of the magnetization of the second ferromagnetic layer 12 is less likely to change than that of the magnetization of the first ferromagnetic layer 11 when a predetermined external force is applied. The first ferromagnetic layer 11 is referred to as a magnetization free layer, and the second ferromagnetic layer 12 is sometimes referred to as a magnetization-fixed layer or a magnetization reference layer. In the laminate 10, the resistance value changes in accordance with the difference between relative angles of the magnetizations of the first ferromagnetic layer 11 and the second ferromagnetic layer 12 sandwiching the non-magnetic layer 13 therebetween.

The first ferromagnetic layer 11 and the second ferromagnetic layer 12 include a ferromagnetic material. Examples of a ferromagnetic material include a metal selected from the group consisting of Cr, Mn, Co, Fe, and Ni; an alloy including one or more kinds of these metals; and an alloy including at least one or more kinds of these metals and elements of B, C, and N. Examples of a ferromagnetic material include a Co—Fe alloy, a Co—Fe—B alloy, a Ni—Fe alloy, a Co—Ho alloy, a Sm—Fe alloy, a Fe—Pt alloy, a Co—Pt alloy, and a CoCrPt alloy.

The first ferromagnetic layer 11 and the second ferromagnetic layer 12 may include a Heusler alloy. A Heusler alloy includes an intermetallic compound having a chemical composition of XYZ or $X_2YZ$. X is a transition metal element or a noble metal element of a Co, Fe, Ni, or Cu group on the periodic table. Y is a transition metal of a Mn, V, Cr or Ti group or an element kind of X. Z is a typical element of Group III to Group V. Examples of a Heusler alloy include $Co_2FeSi$, $Co_2FeGe$, $Co_2FeGa$, $Co_2MnSi$, $Co_2Mn_{1-a}Fe_aAl_bSi_{1-b}$, and $Co_2FeGe_{1-c}Ga_c$. A Heusler alloy has high spin polarizability.

The laminate 10 may have an antiferromagnetic layer with a spacer layer therebetween on a surface of the second ferromagnetic layer 12 on a side opposite to the non-magnetic layer 13. The second ferromagnetic layer 12, the spacer layer, and the antiferromagnetic layer constitute a synthetic antiferromagnetic structure (SAF structure). A synthetic antiferromagnetic structure is constituted of two magnetic layers sandwiching a non-magnetic layer. Due to antiferromagnetic coupling between the second ferromagnetic layer 12 and the antiferromagnetic layer, a coercive force of the second ferromagnetic layer 12 becomes greater than that in a case of having no antiferromagnetic layer. For example, the antiferromagnetic layer is made of IrMn or PtMn. For example, the spacer layer includes at least one selected from the group consisting of Ru, Ir, and Rh.

The laminate 10 may have other layers in addition to the first ferromagnetic layer 11, the second ferromagnetic layer 12, and the non-magnetic layer 13. For example, a base layer may be provided between the wiring 20 and the laminate 10. The base layer enhances crystallinity of each layer constituting the laminate 10.

For example, the wiring 20 comes into contact with one surface of the laminate 10. The wiring 20 is a writing wiring for writing data in the magnetoresistance effect element 100. The wiring 20 extends in the x direction. At least a part of the wiring 20 and the non-magnetic layer 13 sandwich the first ferromagnetic layer 11 therebetween in the z direction.

The wiring 20 generates a spin current due to a spin Hall effect occurring when an electric current I flows and injects spins into the first ferromagnetic layer 11. For example, the wiring 20 applies as many spin-orbit torques (SOT) as the magnetization of the first ferromagnetic layer 11 can be reversed to the magnetization of the first ferromagnetic layer 11. A spin Hall effect is a phenomenon in which a spin current is induced in a direction orthogonal to the direction in which an electric current flows based on a spin-orbit interaction when an electric current flows. A spin Hall effect is similar to an ordinary Hall effect in that a motion (movement) direction is bent due to motion (movement) of electric charges (electrons). In an ordinary Hall effect, the motion direction of charged particles in motion in a magnetic field is bent due to a Lorentz force. In contrast, in a spin Hall effect, the movement direction of spins is bent simply by movement of electrons (simply by a flow of an electric current) even if no magnetic field is present.

For example, when an electric current flows in the wiring 20, first spins oriented in one direction and second spins oriented in a direction opposite to that of the first spins are individually bent due to a spin Hall effect in a direction orthogonal to the direction in which the electric current I flows. For example, the first spins oriented in the negative y direction are bent in the positive z direction, and the second spins oriented in the positive y direction are bent in the negative z direction.

In a non-magnetic material (a material which is not a ferromagnetic material), the number of electrons in the first spins and the number of electrons in the second spins generated due to a spin Hall effect are equivalent to each other. That is, the number of electrons in the first spins toward the positive z direction and the number of electrons in the second spins toward the negative z direction are equivalent to each other. The first spins and the second spins flow in a direction in which uneven distribution of spins is resolved. Since flows of electric charges cancel each other out while the first spins and the second spins move in the z direction, the electric current amount becomes zero. A spin current entailing no electric current is particularly referred to as a pure spin current.

When a flow of electrons in the first spins is expressed as $J_\uparrow$, a flow of electrons in the second spins is expressed as $J_\downarrow$, and a spin current is expressed as $J_S$, the spin current is defined as $J_S=J_\uparrow-J_\downarrow$. The spin current $J_S$ is generated in the z direction. The first spins are injected into the first ferromagnetic layer 11 through the wiring 20.

The wiring 20 includes any of a metal, an alloy, an intermetallic compound, a metal boride, a metal carbide, a metal silicide, and a metal phosphide having a function of generating a spin current due to a spin Hall effect occurring when the electric current I flows.

For example, the wiring 20 includes a non-magnetic heavy metal as a main element. A main element is an element with the highest ratio among the elements constituting the wiring 20. For example, the wiring 20 includes a heavy metal having a specific gravity equal to or greater than that of yttrium (Y). Since a non-magnetic heavy metal has a large atomic number, such as an atomic number of 39 or larger, and has d electrons or f electrons in the outermost shell, a strong spin-orbit interaction occurs. A spin Hall effect occurs due to a spin-orbit interaction, spins are likely to be unevenly distributed inside the wiring 20, and the spin current $J_S$ is likely to be generated. For example, the wiring 20 includes any one selected from the group consisting of Au, Hf, Mo, Pt, W, and Ta.

The wiring 20 may include a magnetic metal. A magnetic metal is a ferromagnetic metal or an antiferromagnetic metal. A very small amount of magnetic metal included in a non-magnetic material becomes a scattering factor of spins. For example, a very small amount indicates an amount equal to or less than 3% of the total mole ratio of the elements constituting the wiring 20. When spins scatter due to the magnetic metal, a spin-orbit interaction increases, and efficiency of generating a spin current with respect to an electric current is enhanced.

The wiring 20 may include a topological insulator. A topological insulator is a substance of which the inside is constituted of an insulator or a high-resistance material but in which a spin-polarized metal state is exhibited on the surface thereof. In a topological insulator, an internal magnetic field is generated due to a spin-orbit interaction. In a topological insulator, a new topological phase is manifested due to the effect of a spin-orbit interaction even if there is no external magnetic field. A topological insulator can generate a pure spin current with high efficiency due to a strong spin-orbit interaction and breakage of reversal symmetry at an edge.

Examples of an topological insulator include SnTe, $Bi_{1.5}Sb_{0.5}Te_{1.7}Se_{1.3}$, $TlBiSe_2$, $Bi_2Te_3$, $Bi_{1-x}Sb_x$, and $(Bi_{1-x}Sb_x)_2Te_3$. A topological insulator can generate a spin current with high efficiency.

The resistor 30 is laminated on the wiring 20. Another layer may be provided between the resistor 30 and the wiring 20. The resistor 30 is sandwiched between the wiring 20 and an electrode E2 (refer to FIG. 2) in the z direction. The resistor 30 is a columnar body.

For example, the resistor 30 has the same layer structure as the laminate 10. The same layer structure denotes that the sequence of laminated layers is the same. For example, the resistor 30 has a first ferromagnetic layer 31, a second ferromagnetic layer 32, and a non-magnetic layer 33. The non-magnetic layer 33 is sandwiched between the first ferromagnetic layer 31 and the second ferromagnetic layer 32 in the z direction. For example, the first ferromagnetic layer 31 comes into contact with the wiring 20 and is laminated on the wiring 20. Each of the first ferromagnetic layer 31, the second ferromagnetic layer 32, and the non-magnetic layer 33 has a material and a constitution similar to those of each of the first ferromagnetic layer 11, the second ferromagnetic layer 12, and the non-magnetic layer 13.

For example, the resistor 30 has shape anisotropy when viewed in the z direction. Having shape anisotropy denotes that a circumscribed ellipse including the resistor 30 has a major axis and a minor axis. For example, the resistor 30 is an ellipse as illustrated in FIG. 4 when viewed in the z direction. The shape of the laminate 10 viewed in the z direction is not limited to this case and may be a circular shape, a quadrangular shape, or an amorphous shape.

For example, an aspect ratio obtained by dividing a major axis length L30a of the resistor 30 by a minor axis length L30b is larger than an aspect ratio obtained by dividing a major axis length L10a of the laminate 10 by a minor axis length L10b. In this case, due to anisotropy energy, the stability of the magnetization of the first ferromagnetic layer 31 is higher than the stability of the magnetization of the first ferromagnetic layer 11.

For example, the volume of the resistor 30 is larger than the volume of the laminate 10. The volume of the first ferromagnetic layer 31 is larger than the volume of the first ferromagnetic layer 11. In addition, when viewed in the z direction, for example, the area of the resistor 30 is larger than the area of the laminate 10. When viewed in the z direction, the area of the first ferromagnetic layer 31 is larger than the area of the first ferromagnetic layer 11. In these cases, saturation magnetization of the first ferromagnetic layer 31 is larger than that of the first ferromagnetic layer 11, and the stability of the magnetization of the first ferromagnetic layer 31 is higher than the stability of the magnetization of the first ferromagnetic layer 11.

A geometrical center C30 of the resistor 30 overlaps a geometrical center C40 of the first conductive part 40 or offsets from the geometrical center C40 of the first conductive part 40 in the x direction away from the laminate 10. FIGS. 3 and 4 exemplify a case in which the geometrical center C30 of the resistor 30 is farther away from the laminate 10 than the geometrical center C40 of the first conductive part 40 in the x direction. For example, the geometrical center C30 of the resistor 30 is within a range overlapping the first conductive part 40.

For example, the position of the geometrical center C30 of the resistor 30 in the y direction coincides with the positions of a geometrical center C10 of the laminate 10, the geometrical center C40 of the first conductive part 40, and a geometrical center C50 of the second conductive part 50 in the y direction. The position of the geometrical center C30 of the resistor 30 in the y direction may offset from the geometrical center C10 of the laminate 10, the geometrical center C40 of the first conductive part 40, and the geometrical center C50 of the second conductive part 50 in the y direction.

The first conductive part 40 and the second conductive part 50 sandwich the laminate 10 therebetween in the x direction in a plan view in the z direction. For example, each of the first conductive part 40 and the second conductive part 50 is connected to the via-wiring V. The first conductive part 40 and the second conductive part 50 are made of a material having excellent conductivity. For example, the first conductive part 40 and the second conductive part 50 include any one selected from the group consisting of Ag, Cu, Co, Al, and Au.

Figure 5:
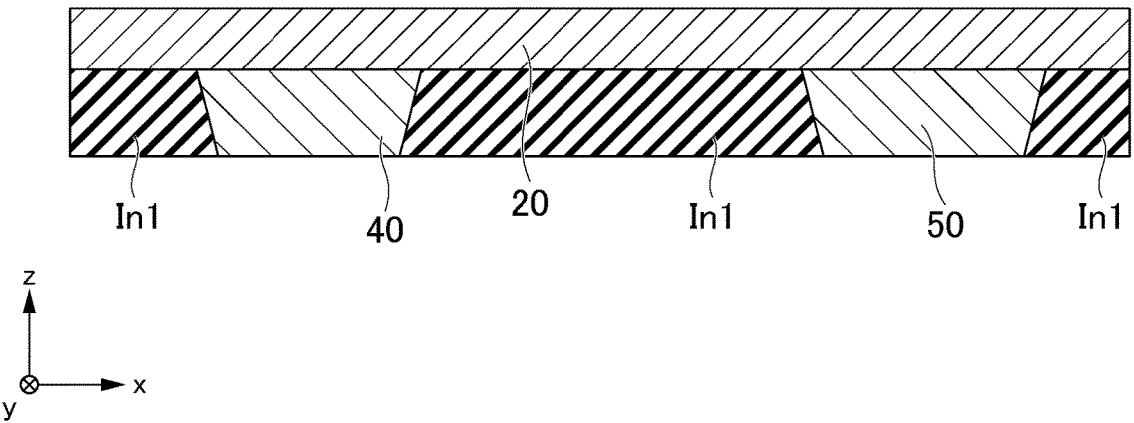
FIG. 5 is an explanatory cross-sectional view of an example of a method for manufacturing the magnetoresistance effect element according to the first embodiment.
Figure 6:
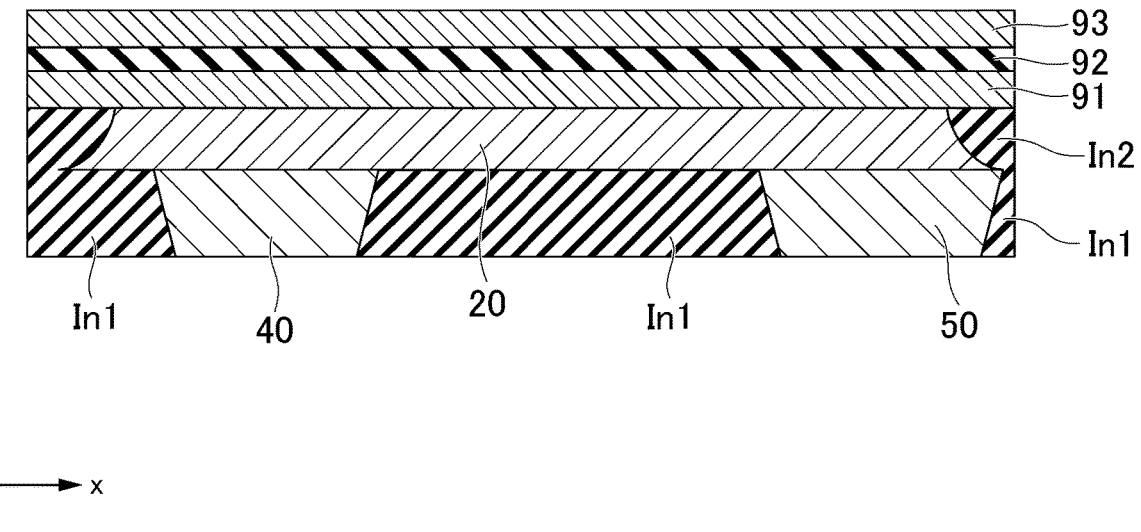
FIG. 6 is another explanatory cross-sectional view of an example of the method for manufacturing the magnetoresistance effect element according to the first embodiment.
Figure 7:
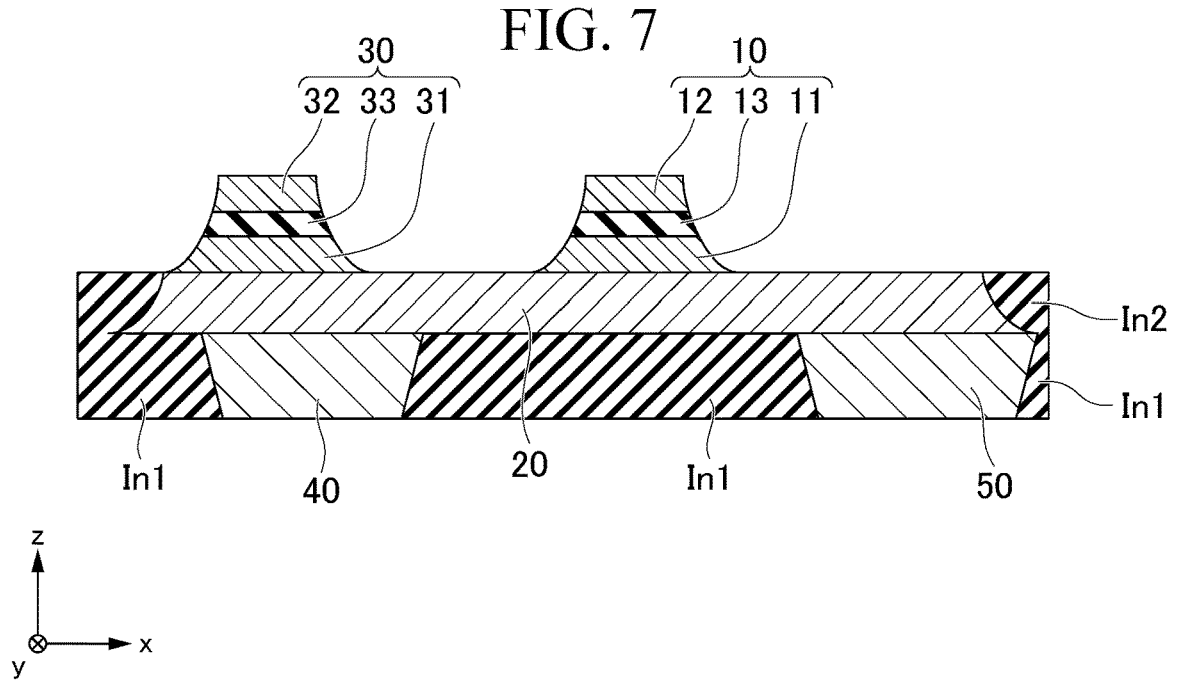
FIG. 7 is another explanatory cross-sectional view of an example of the method for manufacturing the magnetoresistance effect element according to the first embodiment.

Next, the method for manufacturing the integrated region IA of the magnetic recording array 200 will be described. The integrated region IA is formed by a lamination step for each layer and a processing step of processing part of each layer into a predetermined shape. Each layer can be laminated using a sputtering method, a chemical vapor deposition (CVD) method, an electron beam evaporation method (EB evaporation method), an atom laser deposition method. Each layer can be processed using photolithography or the like. FIGS. 5 to 7 are explanatory cross-sectional views of an example of the method for manufacturing the magnetoresistance effect element 100 according to the first embodiment.

First, impurities are doped at a predetermined position on the substrate Sub, and the source region S and the drain region D are formed. Next, the gate insulating film GI and the gate electrode G are laminated in this order at the position between the source region S and the drain region D on the substrate Sub. Next, the insulating layer In is formed such that these are covered.

Next, for example, an opening is formed in the insulating layer by anisotropic etching. The opening is formed at the position between the source region S and the drain region D in a plan view in the z direction. The opening leads to the surface of the substrate Sub. The opening is filled with a conductor, thereby becoming the via-wiring V.

Next, after an insulating layer In1 covering the via-wiring V is laminated, the first conductive part 40 and the second conductive part 50 are formed at positions overlapping the via-wiring V. For example, a material harder than that of the via-wiring V is used for the first conductive part 40 and the second conductive part 50. Surfaces of the insulating layer In1, the first conductive part 40, and the second conductive part 50 are subjected to chemical-mechanical polishing (CMP). Flatness of the surfaces is enhanced by using a hard material for the first conductive part 40 and the second conductive part 50. Next, as illustrated in FIG. 5, a conductive layer 90 is laminated on the insulating layer In1, the first conductive part 40, and the second conductive part 50.

Next, as illustrated in FIG. 6, the conductive layer 90 is processed into a predetermined shape, and the wiring 20 is thereby formed. Next, an area around the wiring 20 is filled with an insulating layer In2. Next, a magnetic layer 91, a non-magnetic layer 92, and a magnetic layer 93 are laminated in this order on the insulating layer In2 and the wiring 20.

Next, as illustrated in FIG. 7, a mask is formed at a predetermined position on the magnetic layer 91, the non-magnetic layer 92, and the magnetic layer 93, and the magnetic layer 91, the non-magnetic layer 92, and the magnetic layer 93 are thereby processed. Parts of the magnetic layer 91, the non-magnetic layer 92, and the magnetic layer 93 become the laminate 10 and the resistor 30. For example, the laminate 10 and the resistor 30 are simultaneously processed. Next, the magnetoresistance effect element 100 illustrated in FIG. 3 is obtained by filling the area around the laminate 10 and the resistor 30 with an insulator.

Next, operation of the magnetic recording array 200 according to the first embodiment will be described. Operation of the magnetic recording array 200 includes a writing operation and a reading operation with respect to the magnetoresistance effect element 100.

First, the writing operation with respect to the magnetoresistance effect element 100 will be described. The writing operation includes a first writing operation for changing the magnetization direction of the first ferromagnetic layer 11 of the laminate 10, and a second writing operation for changing the magnetization direction of the first ferromagnetic layer 31 of the resistor 30. The first writing operation is an operation for storing data in the magnetoresistance effect element 100. The second writing operation is a refresh operation performed when the resistance value of the resistor 30 serving as a reference value deviates. A main part in the writing operation of the magnetic recording array 200 is the first writing operation, and the second writing operation is performed only when necessary.

First, the first writing operation will be described. The control unit of the magnetic recording array 200 turns on the writing transistor WTr and the common transistor CTr leading to the magnetoresistance effect element 100 in which data is to be written. In addition, the control unit of the magnetic recording array 200 turns off the reading transistor RTr and the differential transistor DTr leading to the magnetoresistance effect element 100 in which data is to be written. When the writing transistor WTr and the common transistor CTr are turned on, an electric current flows between the first conductive part 40 and the second conductive part 50 of the wiring 20.

When a writing electric current flows in the wiring 20, a spin Hall effect occurs, and spins are injected into the first ferromagnetic layer 11. Spins injected into the first ferromagnetic layer 11 apply a spin-orbit torque (SOT) to the magnetization of the first ferromagnetic layer 11 and change the orientation direction of the magnetization of the first ferromagnetic layer 11. When the flowing direction of an electric current is reversed, the direction of spins injected into the first ferromagnetic layer 11 is reversed, and thus the orientation direction of the magnetization can be freely controlled.

The resistance value of the laminate 10 in the lamination direction becomes small when the magnetization of the first ferromagnetic layer 11 and the magnetization of the second ferromagnetic layer 12 are parallel to each other and becomes larger when the magnetization of the first ferromagnetic layer 11 and the magnetization of the second ferromagnetic layer 12 are antiparallel to each other. As the resistance value of the laminate 10 in the lamination direction, data is recorded in the magnetoresistance effect element 100.

In the first writing operation, the differential transistor DTr is turned off. In addition, the geometrical center C30 of the resistor 30 is located at a position farther away from the laminate 10 than the geometrical center C40 of the first conductive part 40. For this reason, spins are not injected into the first ferromagnetic layer 31 due to a spin Hall effect, and the resistance value of the resistor 30 does not change. In addition, when the magnetization stability of the first ferromagnetic layer 31 is higher than the magnetization stability of the first ferromagnetic layer 11, erroneous writing with respect to the resistor 30 is further curbed.

Next, the second writing operation will be described. For example, the second writing operation is performed when the resistance value of the resistor 30 fluctuates upon reception of an influence of an external force such as an external magnetic field. The control unit of the magnetic recording array 200 turns on the writing transistor WTr and the differential transistor DTr leading to the magnetoresistance effect element 100 in which the second writing operation is performed. In addition, the control unit of the magnetic recording array 200 turns off the reading transistor RTr and the common transistor CTr leading to the magnetoresistance effect element 100 in which the second writing operation is performed. When the first writing operation is performed simultaneously with the second writing operation, the common transistor CTr may be turned on. When the writing transistor WTr and the differential transistor DTr are turned on, an electric current flows in the lamination direction of the resistor 30.

When an electric current flows in the lamination direction of the resistor 30, spins are injected into the first ferromagnetic layer 31 from the second ferromagnetic layer 32, and the first ferromagnetic layer 31 receives a spin transfer torque (STT). The first ferromagnetic layer 31 changes the orientation direction of the magnetization due to an STT. The orientation direction of the magnetization of the first ferromagnetic layer 31 can be freely changed by changing the flowing direction of an electric current flowing inside the resistor 30. When the orientation direction of the magnetization of the first ferromagnetic layer 31 is directed toward a predetermined direction, the magnetization state of the resistor 30 returns to the initial state. That is, the resistance value of the resistor 30 which has changed due to an influence such as an external force returns to the original reference value.

Even when the first writing operation and the second writing operation are simultaneously performed, the magnetization of the first ferromagnetic layer 31 is unlikely to be reversed and erroneous writing with respect to the resistor 30 is curbed by further increasing the magnetization stability of the first ferromagnetic layer 31 than the magnetization stability of the first ferromagnetic layer 11.

Next, an operation of reading data from the magnetoresistance effect element 100 will be described. The control unit of the magnetic recording array 200 turns on the reading transistor RTr, the differential transistor DTr, and the common transistor CTr leading to the magnetoresistance effect element 100 from which data is to be read. In addition, the control unit of the magnetic recording array 200 turns off the writing transistor WTr leading to the magnetoresistance effect element 100 from which data is to be read.

When these transistors are turned on, an electric current flows in the lamination direction of the laminate 10 and the resistor 30. The electric current amount of an electric current flowing in the lamination direction of the laminate 10 and the resistor 30 at the time of reading is smaller than that of an electric current at the time of writing, and the directions of the magnetizations of the first ferromagnetic layers 11 and 31 do not change. In addition, when the geometrical center C30 of the resistor 30 is disposed within a range overlapping the first conductive part 40 when viewed in the z direction, an electric current flowing along the wiring 20 from the first conductive part 40 to the resistor 30 decreases so that erroneous writing due to the magnetization of the first ferromagnetic layer 31 which has received a spin-orbit torque (SOT) at the time of reading can be curbed.

The electric current amount or the voltage output from the magnetoresistance effect element 100 varies depending on the resistance value of the laminate 10 in the lamination direction. For example, when a reading electric current is a constant electric current, the potential difference of the laminate 10 in the lamination direction changes due to the resistance value of the laminate 10 in the lamination direction. For example, the potential of the reading wiring RL changes. Data recorded in the magnetoresistance effect element 100 can be read by reading the potential thereof. In addition, the resistance value of the resistor 30 is constant, and the potential difference of the resistor 30 in the lamination direction does not change. For example, the potential of the differential wiring DL does not change either. The speed of reading data from the magnetoresistance effect element 100 can be increased by reading the differential between the potential of the differential wiring DL and the potential of the reading wiring RL instead of reading the potential of the reading wiring RL as an actual numerical value.

In the magnetic recording array 200 according to the first embodiment, the resistor 30 serving as a reference is located in a dead space on the wiring 20 so that there is no need to separately provide a reference cell. The reference cell is for data reference and does not record data. The storage capacity per unit area of a memory device is increased by disposing the magnetoresistance effect element 100 for recording data in a region occupied by a reference cell in the memory device.

In addition, the distance between the resistor 30 serving as a reference and the laminate 10 to be measured is short and the parasitic resistance between the reference and a measurement target is reduced so that data can be more accurately read.

In addition, since the resistor 30 serving as a reference and the laminate 10 to be measured are exposed to the same environment, even when the values of the largest resistance and the smallest resistance of the laminate 10 change due to temperature change or the like, data can be accurately read by comparing it to the resistance value of the resistor 30 serving as a reference.

Thus far, an example of the first embodiment has been exemplified, but the present invention is not limited to this example.

Second Embodiment

Figure 8:
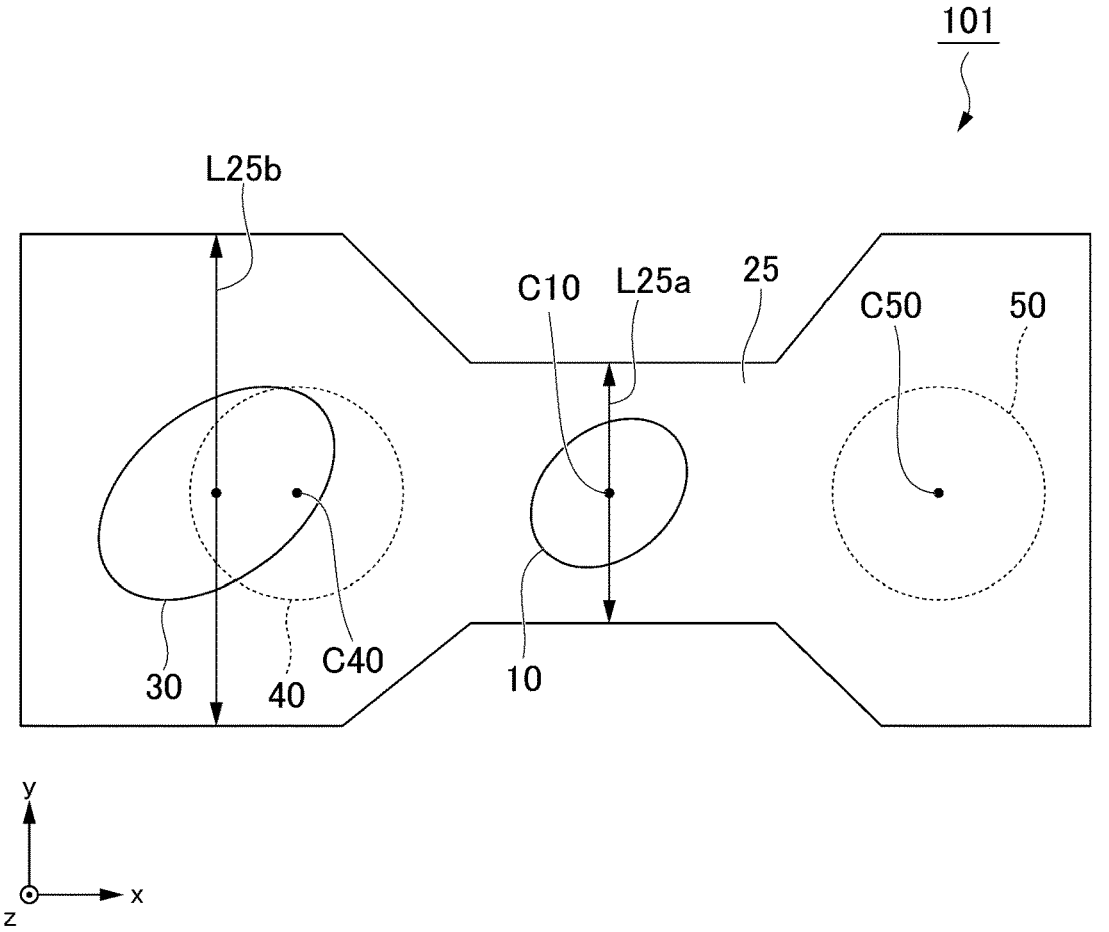
FIG. 8 is a cross-sectional view of a magnetoresistance effect element according to a second embodiment.

FIG. 8 is a plan view of a magnetoresistance effect element 101 according to a second embodiment. In the magnetoresistance effect element 101 according to the second embodiment, the shape of a wiring 25 differs from the shape of the wiring 20 of the magnetoresistance effect element 100. In the second embodiment, description of constitutions similar to those of the first embodiment will be omitted.

The wiring 25 differs simply in shape, and a material similar to that of the wiring 20 is used therefor. The width of the wiring 25 in the y direction is not uniform. A width L25b of the wiring 25 in the y direction at a position of the geometrical center C30 of the resistor 30 is wider than a width L25a of the wiring 25 in the y direction at a position of the geometrical center C10 of the laminate 10. The width of the wiring 25 in the y direction is narrowed from the position overlapping the first conductive part 40 and the second conductive part 50 toward the position overlapping the laminate 10.

In the magnetoresistance effect element 101 according to the second embodiment, it is possible to achieve effects similar to those of the magnetoresistance effect element 100 according to the first embodiment. In addition, since the width of the wiring 25 in the y direction is narrowed toward the laminate 10, the electric current density of an electric current flowing in the wiring 25 becomes high at the position overlapping the laminate 10. When the electric current density of an electric current flowing in the wiring 25 is high, the magnetization of the first ferromagnetic layer 11 is likely to be reversed. In addition, since the electric current density of an electric current at the position overlapping the resistor 30 is low, unexpected reversal of the magnetization of the first ferromagnetic layer 31 can be curbed.

Third Embodiment

Figure 9:
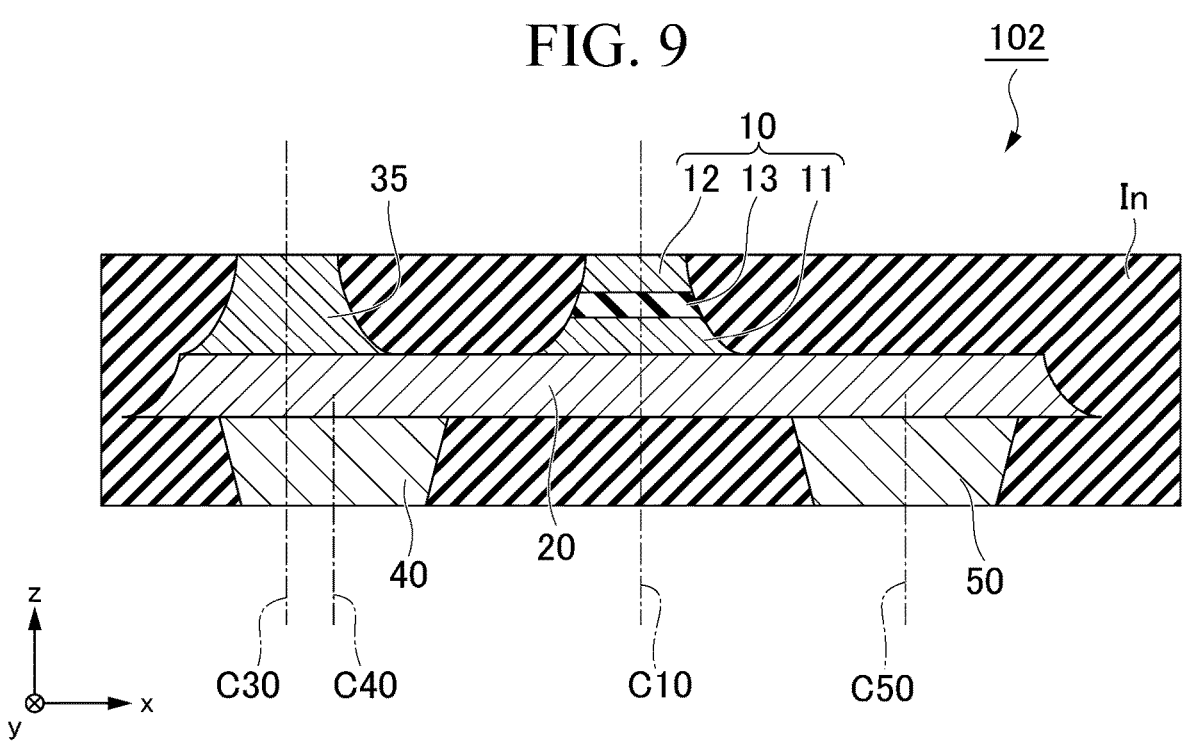
FIG. 9 is a cross-sectional view of a magnetoresistance effect element according to a third embodiment.

FIG. 9 is a cross-sectional view of a magnetoresistance effect element 102 according to a third embodiment. FIG. 9 is a cross section of the magnetoresistance effect element 102 cut along an xz plane passing through the center of the width of the wiring 20 in the y direction. In the magnetoresistance effect element 102 according to the third embodiment, the constitution of a resistor 35 differs from that of the resistor 30 of the magnetoresistance effect element 100. In the third embodiment, description of constitutions similar to those of the first embodiment will be omitted.

The resistor 35 is laminated on the wiring 20. The resistor 35 is sandwiched between the wiring 20 and the electrode E2 (refer to FIG. 2) in the z direction. The resistor 35 is a columnar body. The resistor 35 has a layer structure which differs from that of the laminate 10. For example, the resistance value of the resistor 35 is between a resistance value in an equilibrium state in which the magnetizations of the first ferromagnetic layer 11 and the second ferromagnetic layer 12 of the laminate 10 are parallel to each other and a resistance value in an anti-equilibrium state in which the magnetizations of the first ferromagnetic layer 11 and the second ferromagnetic layer 12 of the laminate 10 are anti-parallel to each other. Data is read from the magnetoresistance effect element 102 by comparing the resistance value or the potential difference of the resistor 35 in the lamination direction and the resistance value or the potential difference of the laminate 10 in the lamination direction.

In the magnetoresistance effect element 102 according to the third embodiment, it is possible to achieve effects similar to those of the magnetoresistance effect element 100 according to the first embodiment.

Fourth Embodiment

Figure 10:
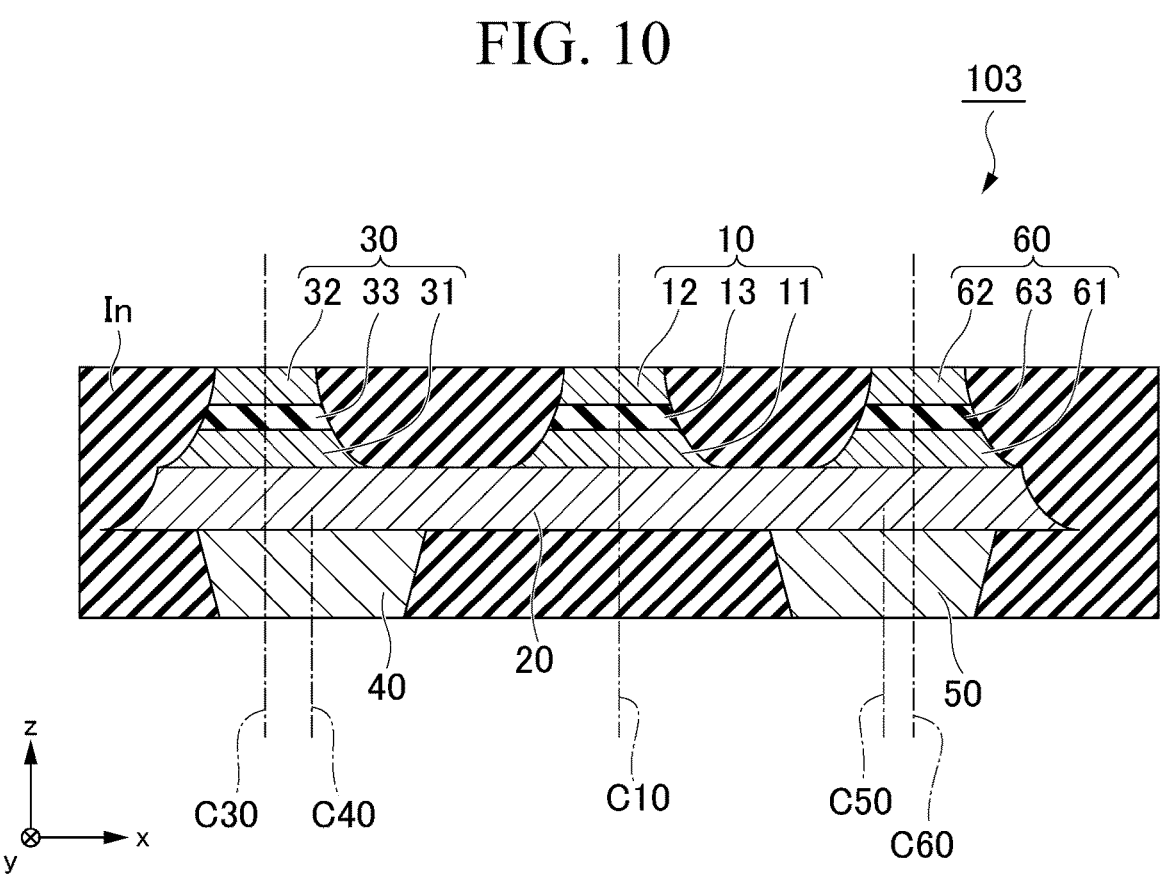
FIG. 10 is a cross-sectional view of a magnetoresistance effect element according to a fourth embodiment.

FIG. 10 is a cross-sectional view of a magnetoresistance effect element 103 according to a fourth embodiment. FIG.

10 is a cross section of the magnetoresistance effect element 103 cut along an xz plane passing through the center of the width of the wiring 20 in the y direction. The magnetoresistance effect element 103 according to the third embodiment differs from the magnetoresistance effect element 100 in further having a resistor 60. In the fourth embodiment, description of constitutions similar to those of the first embodiment will be omitted.

The resistor 60 is laminated on the wiring 20. Another layer may be provided between the resistor 60 and the wiring 20. The resistor 60 is a columnar body.

For example, the resistor 60 has the same layer structure as the laminate 10 and the resistor 30. For example, the resistor 60 is processed simultaneously with the laminate 10 and the resistor 30 from the magnetic layer 91, the non-magnetic layer 92, and the magnetic layer 93 (refer to FIG. 6).

For example, the resistor 60 has a first ferromagnetic layer 61, a second ferromagnetic layer 62, and a non-magnetic layer 63. The non-magnetic layer 63 is sandwiched between the first ferromagnetic layer 61 and the second ferromagnetic layer 62 in the z direction. For example, the first ferromagnetic layer 61 comes into contact with the wiring 20 and is laminated on the wiring 20. Each of the first ferromagnetic layer 61, the second ferromagnetic layer 62, and the non-magnetic layer 63 has a material and a constitution similar to those of each of the first ferromagnetic layer 11, the second ferromagnetic layer 12, and the non-magnetic layer 13.

For example, the resistor 60 has shape anisotropy when viewed in the z direction. Having shape anisotropy denotes that a circumscribed ellipse including the resistor 60 has a major axis and a minor axis. For example, the resistor 60 has an elliptical shape, a circular shape, a quadrangular shape, or an amorphous shape when viewed in the z direction.

For example, the aspect ratio of the resistor 60 is larger than the aspect ratio of the laminate 10. For example, the volume of the resistor 60 is larger than the volume of the laminate 10. The volume of the first ferromagnetic layer 61 is larger than the volume of the first ferromagnetic layer 11. In addition, when viewed in the z direction, for example, the area of the resistor 60 is larger than the area of the laminate 10. When viewed in the z direction, the area of the first ferromagnetic layer 61 is larger than the area of the first ferromagnetic layer 11.

A geometrical center C60 of the resistor 60 overlaps the geometrical center C50 of the second conductive part 50 or offsets from the geometrical center C50 of the second conductive part 50 in the x direction away from the laminate 10. FIG. 10 exemplifies a case in which the geometrical center C60 of the resistor 60 is farther away from the laminate 10 than the geometrical center C50 of the second conductive part 50 in the x direction. For example, the geometrical center C60 of the resistor 60 is within a range overlapping the second conductive part 50.

For example, the position of the geometrical center C60 of the resistor 60 in the y direction coincides with the positions of the geometrical center C10 of the laminate 10, the geometrical center C40 of the first conductive part 40, the geometrical center C50 of the second conductive part 50, and the geometrical center C30 of the resistor 30 in the y direction. The position of the geometrical center C60 of the resistor 60 in the y direction may offset from the geometrical center C10 of the laminate 10, the geometrical center C40 of the first conductive part 40, the geometrical center C50 of the second conductive part 50, and the geometrical center C30 of the resistor 30 in the y direction.

Figure 11:
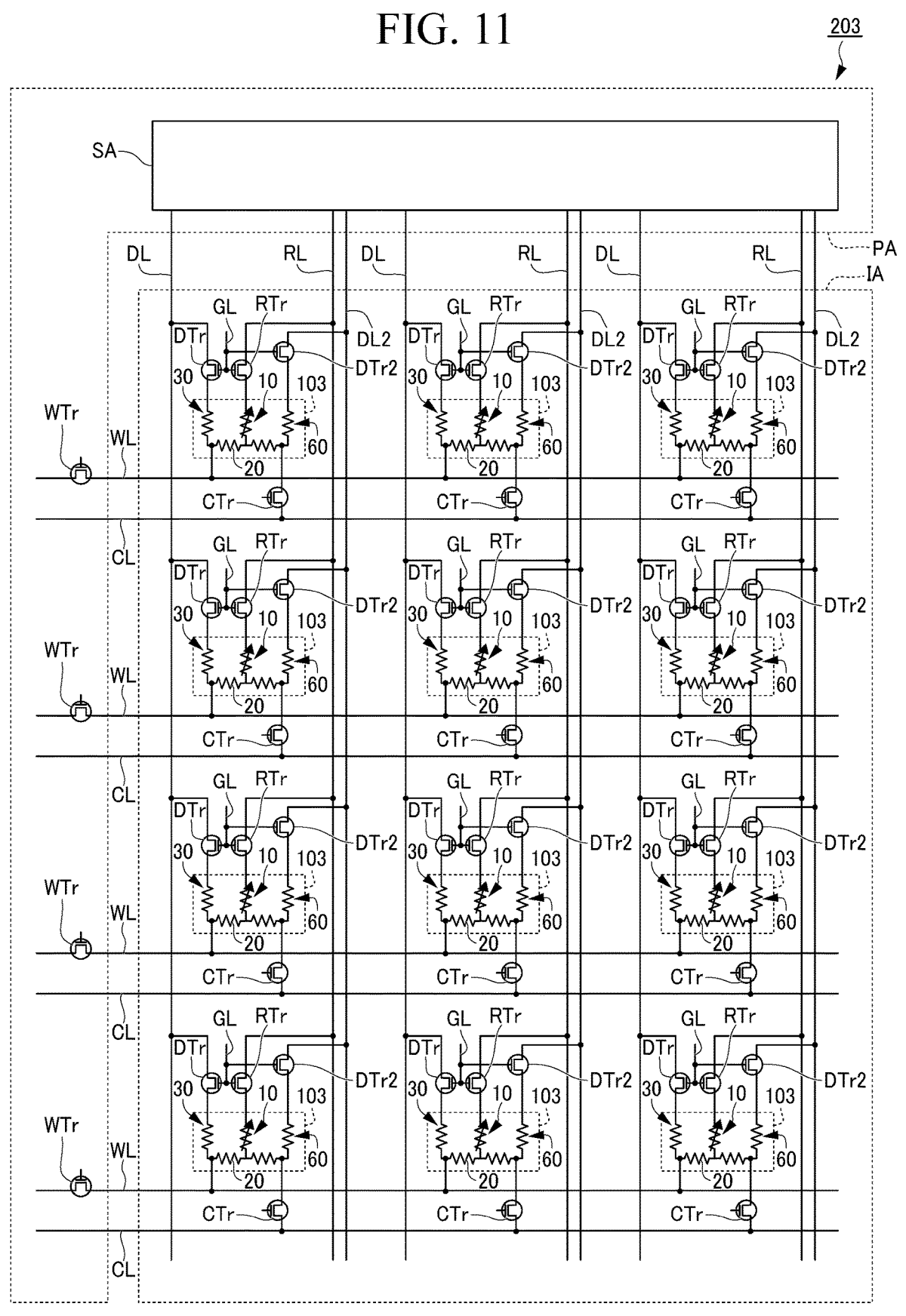

FIG. 11 is a circuit diagram of a magnetic recording array 203 having the magnetoresistance effect elements 103 according to the fourth embodiment. The magnetic recording array 203 differs from the magnetic recording array 200 illustrated in FIG. 1 in that the magnetoresistance effect elements 100 are replaced with the magnetoresistance effect elements 103 and the magnetic recording array 203 further has second differential transistors DTr2 and second differential wirings DL2.

The second differential wirings DL2 are electrically connected to the resistors 60 of the magnetoresistance effect elements 103. The second differential wirings DL2 are connected throughout the respective magnetoresistance effect elements 103 which belong to the same column or row. For example, the second differential wirings DL2 are connected to the respective magnetoresistance effect elements 103 in the same column.

The second differential transistors DTr2 are connected to the second differential wirings DL2. The second differential transistors DTr2 control an electric current flowing between the second differential wirings DL2 and the resistors 60. For example, gate electrodes of the second differential transistors DTr2 are connected to the same gate wirings GL as the gate electrodes of the reading transistors RTr and the gate electrodes of the differential transistors DTr. For example, the differential transistors DTr, the second differential transistors DTr2, and the reading transistors RTr simultaneously switch between ON and OFF.

In the magnetoresistance effect element 103, the magnetization direction of the first ferromagnetic layer 31 and the magnetization direction of the second ferromagnetic layer 32 of the resistor 30 may be parallel to each other, and the magnetization direction of the first ferromagnetic layer 61 and the magnetization direction of the second ferromagnetic layer 62 of the resistor 60 may be antiparallel to each other. In addition, in contrast, the magnetization direction of the first ferromagnetic layer 31 and the magnetization direction of the second ferromagnetic layer 32 of the resistor 30 may be antiparallel to each other, and the magnetization direction of the first ferromagnetic layer 61 and the magnetization direction of the second ferromagnetic layer 62 of the resistor 60 may be parallel to each other.

For example, the magnetization state of the resistor 30 and the magnetization state of the resistor 60 can be in a different state by the following method. For example, first, the magnetization states of the resistor 30 and the resistor 60 are caused to be the same state (initial state), and then an electric current is caused to flow in the lamination direction of one resistor. When a sufficiently large electric current flows in the lamination direction of the resistor, the magnetization state of the laminate to which an electric current is applied changes due to a spin transfer torque. As a result, the magnetization states of the resistor 30 and the resistor 60 become different states. When the resistor 30 and the resistor 60 are produced by processing one lamination film, the magnetization states of the resistor 30 and the resistor 60 become the initial state.

In addition, for example, the resistor 30 and the resistor 60 may have different sizes so as to change coercive forces of the magnetic materials included in the respective resistors. When an external magnetic field is applied to the resistor 30 and the resistor 60 in the initial state, only the magnetization state of one resistor changes due to the difference between the coercive forces.

In this case, the resistor 30 has a reference value with respect to a lower limit value for the resistance value of the laminate 10, and the resistor 60 has a reference value with respect to an upper limit value for the resistance value of the laminate 10. In addition, by setting the average value of an resistance value in an equilibrium state and the resistance value or the potential difference in an anti-equilibrium state as the reference value, comparison with the resistance value or the potential difference of the laminate 10 becomes more accurate, data recorded in the magnetoresistance effect element 103 can be more accurately output.

Fifth Embodiment

Figure 12:
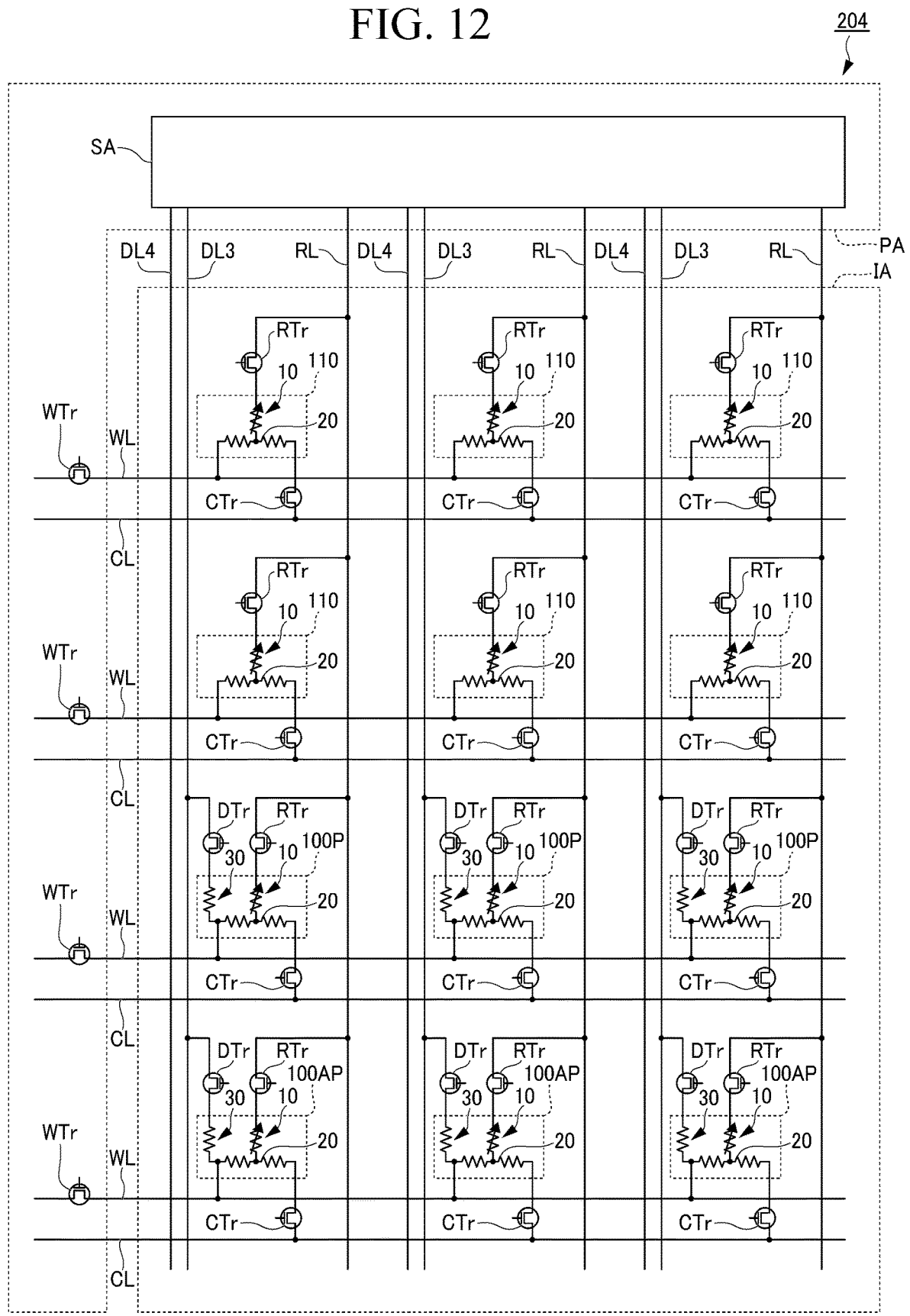
FIG. 12 is a circuit diagram of a magnetic recording array according to a fifth embodiment.

FIG. 12 is a circuit diagram of a magnetic recording array 204 according to a fifth embodiment. The magnetic recording array 204 according to the fifth embodiment has three kinds of magnetoresistance effect elements 110, 100P, and 100AP within the integrated region IA. All the magnetoresistance effect elements 110, 100P, and 100AP are examples of the resistance change elements. In the fifth embodiment, description of constitutions similar to those of the first embodiment will be omitted.

A magnetoresistance effect element 110 differs from the magnetoresistance effect element 100 in not having the resistor 30. The magnetoresistance effect element 110 has the laminate 10, the wiring 20, the first conductive part 40 (not illustrated), and the second conductive part 50 (not illustrated).

The constitutions of the magnetoresistance effect elements 100P and 100AP are the same as the magnetoresistance effect element 100 described above.

In the magnetoresistance effect element 100P, the magnetization direction of the first ferromagnetic layer 31 and the magnetization direction of the second ferromagnetic layer 32 in the resistor 30 are parallel to each other. The resistor 30 of the magnetoresistance effect element 100P is connected to a differential wiring DL3 via the differential transistor DTr. The magnetoresistance effect element 100P is an example of a first element.

In the magnetoresistance effect element 100AP, the magnetization direction of the first ferromagnetic layer 31 and the magnetization direction of the second ferromagnetic layer 32 in the resistor 30 are antiparallel to each other. The resistor 30 of the magnetoresistance effect element 100AP is connected to a differential wiring DL4 via the differential transistor DTr. The magnetoresistance effect element 100AP is an example of the first element.

The differential wiring DL3 and the differential wiring DL4 are connected to the sense amplifier SA. The differential wiring DL3 transfers the resistance value or the potential difference when the resistor 30 is in an equilibrium state to the sense amplifier SA. The differential wiring DL4 transfers the resistance value or the potential difference when the resistor 30 is in an anti-equilibrium state to the sense amplifier SA.

When data in the magnetoresistance effect element 110 is read, an electric current is also applied to the resistors 30 of the magnetoresistance effect elements 100P and 100AP, and data from the magnetoresistance effect element 110 and data from the magnetoresistance effect elements 100P and 100AP are compared to each other. In the magnetic recording array 204, data in the magnetoresistance effect element 110 having no resistor 30 can also be subjected to differential reading by comparing data thereof.

Sixth Embodiment

Figure 13:
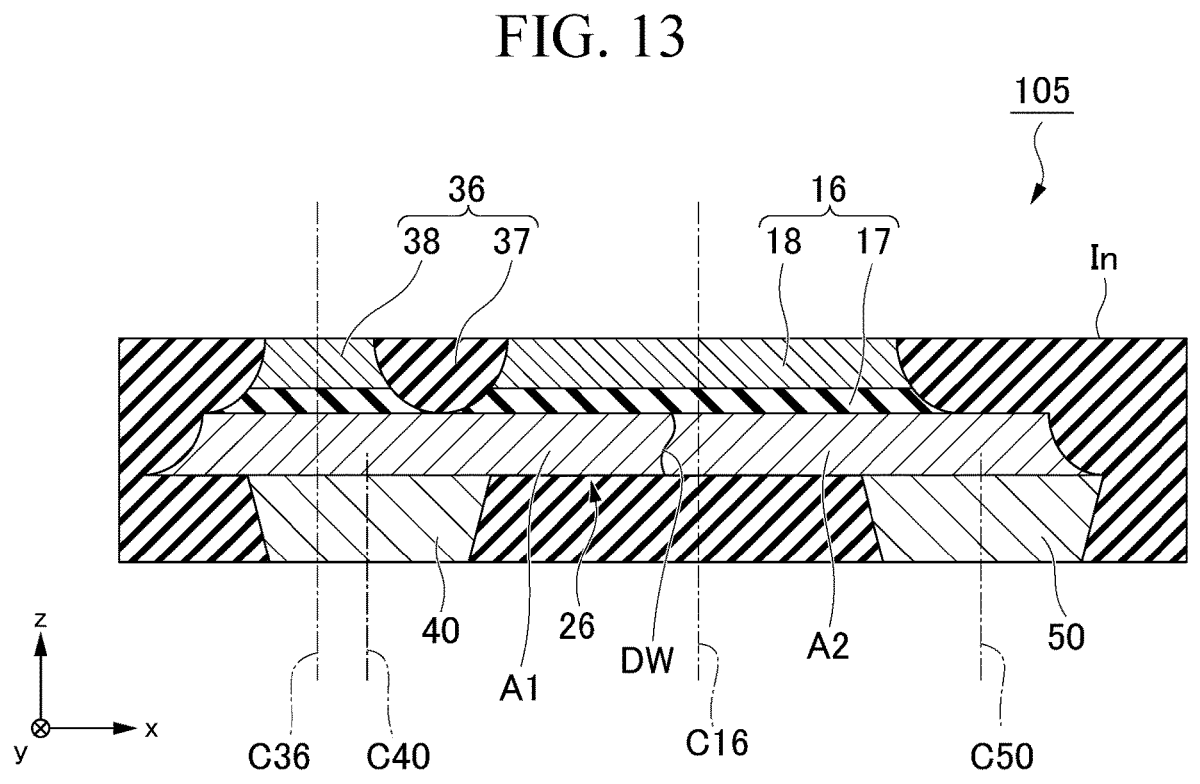

FIG. 13 is a cross-sectional view of a magnetoresistance effect element 105 according to a sixth embodiment. FIG. 13 is a cross section of the magnetoresistance effect element 105 cut along an xz plane passing through the center of the width of a wiring 26 in the y direction. The magnetoresistance effect element 105 differs from the magnetoresistance effect element 100 in that a laminate 16 is constituted of a non-magnetic layer 17 and a first ferromagnetic layer 18 from a side closer to the wiring 26, and a resistor 36 is constituted of a non-magnetic layer 37 and a first ferromagnetic layer 38 from a side closer to the wiring 26. Similar reference signs are applied to constitutions similar to those of the magnetoresistance effect element 100, and description thereof will be omitted.

The magnetoresistance effect element 105 includes the laminate 16, the wiring 26, the resistor 36, the first conductive part 40, and the second conductive part 50. The laminate 16 has the non-magnetic layer 17 and the first ferromagnetic layer 18 from a side closer to the wiring 26. The resistor 36 has the non-magnetic layer 37 and the first ferromagnetic layer 38 from a side closer to the wiring 26. The laminate 16 and the resistor 36 have the same layer structure. The magnetoresistance effect element 105 is an element of which the resistance value changes in accordance with movement of a magnetic wall DW and may be referred to as a magnetic wall movement element or a magnetic wall movement-type magnetoresistance effect element.

The wiring 26 is a magnetic layer. The wiring 26 includes a ferromagnetic material. Regarding a magnetic material constituting the wiring 26, it is possible to use a metal selected from the group consisting of Cr, Mn, Co, Fe, and Ni; an alloy including one or more kinds of these metals; an alloy including at least one or more kinds of these metals and elements of B, C, and N; or the like. Specific examples thereof include Co—Fe, Co—Fe—B, and Ni—Fe.

The wiring 26 is a layer in which information can be magnetically recorded by means of change in magnetic state therein. The wiring 26 internally has a first magnetic domain A1 and a second magnetic domain A2. For example, the magnetization of the first magnetic domain A1 and the magnetization of the second magnetic domain A2 are oriented in directions opposite to each other. A boundary between the first magnetic domain A1 and the second magnetic domain A2 is the magnetic wall DW. The wiring 26 can internally have the magnetic wall DW.

The magnetoresistance effect element 105 can record data in multiple values or consecutively depending on the position of the magnetic wall DW of the wiring 26. Data recorded in the wiring 26 are read as a change in the resistance value of the magnetoresistance effect element 105 when a reading electric current is applied.

The magnetic wall DW moves by causing a writing electric current to flow in the x direction of the wiring 26 or applying an external magnetic field. For example, when a writing electric current (for example, an electric current pulse) is applied in the positive x direction of the wiring 26, electrons flow in the negative x direction opposite to that of an electric current, and thus the magnetic wall DW moves in the negative x direction. When an electric current flows from the first magnetic domain A1 toward the second magnetic domain A2, electrons spin-polarized in the second magnetic domain A2 cause magnetization reversal of the magnetization of the first magnetic domain A1. Due to magnetization reversal of the magnetization of the first magnetic domain A1, the magnetic wall DW moves in the negative x direction.

A material similar to that of the non-magnetic layer 13 according to the first embodiment can be used for the non-magnetic layers 17 and 37. A material similar to that of the second ferromagnetic layer 12 according to the first embodiment can be used for the first ferromagnetic layers 18 and 38.

A geometrical center C36 of the resistor 36 overlaps the geometrical center C40 of the first conductive part 40 or is farther away from the laminate 16 than the geometrical center C40 of the first conductive part 40 in the x direction. FIG. 13 exemplifies a case in which the geometrical center C36 of the resistor 36 is farther away from the laminate 10 than the geometrical center C40 of the first conductive part 40 in the x direction. For example, the geometrical center C36 of the resistor 36 is within a range overlapping the first conductive part 40.

The resistance value or the potential difference of the resistor 36 in the lamination direction becomes a reference for the resistance value or the potential difference of the laminate 16 in the lamination direction. Since the resistor 36 serving as a reference is located in the vicinity of the laminate 16, data recorded in the laminate 16 can be accurately read. In addition, integration of the magnetic recording array can be enhanced by disposing a reference in an area which becomes a dead space of the magnetoresistance effect element 105.

REFERENCE SIGNS LIST

10, 16 Laminate
11, 18, 31, 38, 61 First ferromagnetic layer
12, 32, 62 Second ferromagnetic layer
13, 17, 33, 37, 63, 92 Non-magnetic layer
20, 25, 26 Wiring
30, 35, 36, 60 Resistor
40 First conductive part
50 Second conductive part
90 Conductive layer
91, 93 Magnetic layer
100, 100AP, 100P, 101, 102, 103, 105, 110 Magnetoresistance effect element
200, 203, 204 Magnetic recording array
C10, C30, C36, C40, C50, C60 Geometrical center
CL Common wiring
CTr Common transistor
DL, DL3, DLA Differential wiring
DL2 Second differential wiring
DTr Differential transistor
DTr2 Second differential transistor
RL Reading wiring
RTr Reading transistor
WL Writing wiring
WTr Writing transistor

What is claimed is:
1. A magnetoresistance effect element comprising:
a wiring that extends in a first direction;
a laminate that includes a first ferromagnetic layer connected to the wiring;
a first conductive part and a second conductive part that sandwich the first ferromagnetic layer therebetween in a plan view in a lamination direction; and
a resistor,
wherein,
in the plan view in the lamination direction, a geometrical center of the resistor overlaps a geometrical center of the first conductive part or offsets from the geometrical center of the first conductive part in the first direction away from the laminate, and the first conductive part and the second conductive part sandwich the laminate in the first direction intersecting the lamination direction.

2. The magnetoresistance effect element according to claim 1, wherein a resistance value or a potential difference of the resistor in the lamination direction is referred to as a resistance value or a potential difference of the laminate in the lamination direction.

3. The magnetoresistance effect element according to claim 1, wherein the resistor has the same layer structure as the laminate, and wherein the resistor includes the first ferromagnetic layer.

4. The magnetoresistance effect element according to claim 1, wherein the laminate has the first ferromagnetic layer, a second ferromagnetic layer, and a non-magnetic layer provided between the first ferromagnetic layer and the second ferromagnetic layer.

5. The magnetoresistance effect element according to claim 3, wherein a volume of the first ferromagnetic layer in the resistor is larger than a volume of the first ferromagnetic layer in the laminate.

6. The magnetoresistance effect element according to claim 3, wherein an area of the first ferromagnetic layer in the resistor is larger than an area of the first ferromagnetic layer in the laminate when viewed in the lamination direction.

7. The magnetoresistance effect element according to claim 3, wherein the laminate and the resistor have shape anisotropy when viewed in the lamination direction, and an aspect ratio of a major axis to a minor axis in the resistor is larger than an aspect ratio of a major axis to a minor axis in the laminate.

8. The magnetoresistance effect element according to claim 3 further comprising:

a control unit that controls a first writing operation and a second writing operation, wherein the first writing operation includes causing an electric current to flow between the first conductive part and the second conductive part and changing a magnetization direction of the first ferromagnetic layer of the laminate, and the second writing operation includes causing an electric current to flow in the lamination direction of the resistor and changing a magnetization direction of the first ferromagnetic layer of the resistor.

9. The magnetoresistance effect element according to claim 1, wherein the geometrical center of the resistor is located at a position overlapping the first conductive part when viewed in the lamination direction.

10. The magnetoresistance effect element according to claim 1, wherein a width of the wiring in a second direction at a position of the geometrical center of the resistor is wider than a width of the wiring in the second direction at a position of a geometrical center of the laminate, the second direction being orthogonal to the first direction and the lamination direction.

11. The magnetoresistance effect element according to claim 1 further comprising:

a first transistor that is connected to the resistor; and a second transistor that is connected to the laminate, wherein a gate electrode of the first transistor and a gate electrode of the second transistor are connected to the same gate wiring.

12. The magnetoresistance effect element according to claim 1 further comprising:

a sense amplifier that is connected to the resistor and the laminate.

13. The magnetoresistance effect element according to claim 1 further comprising:

a second resistor, wherein, in the plan view in the lamination direction, a geometrical center of the second resistor overlaps a geometrical center of the second conductive part or offsets from the geometrical center of the second conductive part in the first direction away from the laminate.

14. A magnetic recording array comprising:

the magnetoresistance effect element according to claim 1.

15. The magnetic recording array according to claim 14 comprising:

a plurality of resistance change elements that are arrayed in a matrix shape, wherein some of the plurality of resistance change elements are magnetoresistance effect elements, each of which is the magnetoresistance effect element according to claim 14.

16. The magnetic recording array according to claim 14 further comprising:

a plurality of magnetoresistance effect elements, wherein each of the resistors in the magnetoresistance effect elements has the first ferromagnetic layer, a second ferromagnetic layer, and a non-magnetic layer provided between the first ferromagnetic layer and the second ferromagnetic layer, wherein the plurality of the magnetoresistance effect elements each have a first element and a second element, wherein in the first element, a magnetization direction of the first ferromagnetic layer and a magnetization direction of the second ferromagnetic layer in the resistor are parallel to each other, and wherein in the second element, the magnetization direction of the first ferromagnetic layer and the magnetization direction of the second ferromagnetic layer in the resistor are antiparallel to each other.

17. The magnetic recording array according to claim 16 further comprising:

a plurality of resistance change elements that are arrayed in a matrix shape, wherein each of element groups has the first element and the second element, the element groups being constituted of the resistance change elements which belong to the same row or column in the plurality of resistance change elements.

18. The magnetic recording array according to claim 14, wherein all of the plurality of resistance change elements are the magnetoresistance effect elements.

19. The magnetoresistance effect element according to claim 1, wherein the resistor is separate from the laminate.

* * * * *